(12) United States Patent
Niki

(10) Patent No.: US 12,044,399 B2
(45) Date of Patent: Jul. 23, 2024

(54) METHOD OF MANUFACTURING LIGHT-EMITTING DEVICE, METHOD OF MANUFACTURING LIGHT EMITTING MODULE, AND LIGHT-EMITTING DEVICE

(71) Applicant: NICHIA CORPORATION, Anan (JP)

(72) Inventor: Isamu Niki, Anan (JP)

(73) Assignee: NICHIA CORPORATION, Anan (JP)

( * ) Notice: Subject to any disclaimer, the term of this patent is extended or adjusted under 35 U.S.C. 154(b) by 128 days.

(21) Appl. No.: 17/551,143

(22) Filed: Dec. 14, 2021

(65) Prior Publication Data

US 2022/0107078 A1 Apr. 7, 2022

Related U.S. Application Data

(62) Division of application No. 16/585,502, filed on Sep. 27, 2019, now Pat. No. 11,231,162.

(30) Foreign Application Priority Data

Sep. 28, 2018 (JP) ................................ 2018-184515

(51) Int. Cl.
| | |
|---|---|
| *F21V 9/35* | (2018.01) |
| *F21V 9/30* | (2018.01) |
| *F21V 19/00* | (2006.01) |
| *F21Y 115/30* | (2016.01) |
| *H01S 5/00* | (2006.01) |

(Continued)

(52) U.S. Cl.
CPC .................. *F21V 9/35* (2018.02); *F21V 9/30* (2018.02); *F21V 19/002* (2013.01); *H01S 5/0087* (2021.01); *H05K 1/18* (2013.01); *H05K 3/306* (2013.01); *F21Y 2115/30* (2016.08);

(Continued)

(58) Field of Classification Search
CPC ............. F21S 41/16; F21S 41/141–148; F21S 41/19; F21S 41/192; H01S 5/023–02385; H01L 25/075–0753
See application file for complete search history.

(56) References Cited

U.S. PATENT DOCUMENTS 7,182,627 B1    2/2007  Huang
9,551,479 B2 *  1/2017  Groetsch ............... H01L 33/486
(Continued)

FOREIGN PATENT DOCUMENTS

CN    109210451 A    1/2019
JP    2006032584 A   2/2006
(Continued)

OTHER PUBLICATIONS

Restriction Requirement in the related U.S. Appl. No. 16/585,502, dated Feb. 9, 2021.

(Continued)

*Primary Examiner* — Mariceli Santiago
(74) *Attorney, Agent, or Firm* — Global IP Counselors, LLP

(57) ABSTRACT

A method of manufacturing a light-emitting device includes: providing a light source including a first substrate and a light-emitting element coupled to the first substrate; and after the providing of the light source, forming one or more positioning holes in the first substrate at locations spaced apart from a light-emitting part of the light source by predetermined distances in a top plan view.

21 Claims, 6 Drawing Sheets

(51) Int. Cl.
*H05K 1/18* (2006.01)
*H05K 3/30* (2006.01)

(52) U.S. Cl.
CPC .... *H01S 5/005* (2013.01); *H05K 2201/09063* (2013.01); *H05K 2201/10189* (2013.01)

(56) References Cited

U.S. PATENT DOCUMENTS

| | | |
|---|---|---|
| 2010/0008095 A1 | 1/2010 | Tsukamoto |
| 2011/0210664 A1 | 9/2011 | Hisayasu et al. |
| 2012/0188766 A1 | 7/2012 | Lu et al. |
| 2017/0038056 A1 | 2/2017 | Joiris |
| 2019/0041020 A1 | 2/2019 | Sato |
| 2019/0086049 A1* | 3/2019 | Onoda ................ F21S 41/16 |

FOREIGN PATENT DOCUMENTS

| | | |
|---|---|---|
| JP | 2010020917 A | 1/2010 |
| JP | 2011-181248 A | 9/2011 |
| JP | 2016-100239 A | 5/2016 |
| JP | 2016095954 A | 5/2016 |
| JP | 2017-157669 A | 9/2017 |
| WO | 2015090970 A1 | 6/2015 |
| WO | 2017/179465 A1 | 10/2017 |
| WO | WO-2018180950 A1 * | 10/2018 .............. F21S 41/16 |

OTHER PUBLICATIONS

Non Final Office Action in the related U.S. Appl. No. 16/585,502, dated Apr. 15, 2021.

Notice of Allowance in the related U.S. Appl. No. 16/585,502, dated Sep. 17, 2021.

* cited by examiner

METHOD OF MANUFACTURING LIGHT-EMITTING DEVICE, METHOD OF MANUFACTURING LIGHT EMITTING MODULE, AND LIGHT-EMITTING DEVICE

CROSS-REFERENCE TO RELATED PATENT APPLICATION

This application is a divisional application of U.S. patent application Ser. No. 16/585,502, filed on Sep. 27, 2019. This application claims priority to Japanese Patent Application No. 2018-184515 filed on Sep. 28, 2018. The entire disclosures of U.S. patent application Ser. No. 16/585,502 and Japanese Patent Application No. 2018-184515 are hereby incorporated herein by reference.

BACKGROUND

Technical Field

The present disclosure relates to a method of manufacturing a light-emitting device, a method of manufacturing a light emitting module, and a light-emitting device.

Description of Related Art

When a light-emitting device having a light-emitting element is configured to be used in a light-emitting module, one or more positioning holes are generally formed in a substrate adapted for mounting a light-emitting element before assembling the components of the light-emitting device. At the time of mounting the light-emitting device on a substrate of a light-emitting module, one or more positioning pins formed on the substrate of the light emitting module are respectively fit into the positioning holes. This allows automatic arrangement of the light-emitting element at a location a predetermined distance from the positioning pin, without separately adjusting the position of the light-emitting device when the light-emitting device is mounted on the light emitting module (for example, see Japanese Unexamined Patent Application Publication No. 2010-20917).

SUMMARY OF THE INVENTION

However, when the positioning hole is formed in the substrate before assembling the light-emitting device, a relatively low positional accuracy between the light emitting part and the positioning hole in the substrate in the assembled light-emitting device may result, due to dimensional errors in the components and/or an error in assembling the light-emitting device. Also, if electrical connection with the light-emitting element limits a region on the substrate available for mounting the light-emitting element, the light-emitting element or the light emitting part may not be able to be mounted with positioning relative to the positioning hole that has already been formed. In particular, in assembling a light-emitting device having a semiconductor laser element and a wavelength converting member, if the semiconductor laser element is mounted on a substrate, and then the wavelength converting member is secured while adjusting the relative position with the semiconductor laser element, the location of the wavelength converting member that is the light emitting part of the light-emitting device may differ in each of the light-emitting devices, due to a mounting error of the semiconductor laser element. For example, when the light-emitting device is assembled with adjusting the location of the wavelength converting member such that the center portion of the laser light from the semiconductor laser element and the center portion of the wavelength converting member are aligned, if the mounting location of the semiconductor laser element varies in each of the light-emitting devices, the location of the light emitting part of each of the light-emitting devices may also vary. Accordingly, positional accuracy between the light emitting part and the positioning hole is likely to be lower in the light-emitting device having the semiconductor laser element and the wavelength converting member than that of the light-emitting device that does not include the wavelength converting member. Accordingly, an object of the present disclosure is to provide a method of manufacturing a light-emitting device, a method of manufacturing a light-emitting module, and a light-emitting device, with improved positional accuracy between the light emitting part and the positioning hole, in an assembled light-emitting device.

The present disclosure includes: a method of manufacturing a light-emitting device including: providing a light source including a first substrate and a light-emitting element coupled to the first substrate; and after the providing of the light source, forming one or more positioning holes in the first substrate at locations spaced apart from a light-emitting part of the light source by predetermined distances in a top plan view.

According to the method of manufacturing a light-emitting device and the method of manufacturing a light-emitting module, according to the present disclosure, positional accuracy between the light-emitting part and the positioning hole, in the assembled light-emitting device can be improved. Further, the light-emitting device according to the present disclosure is assembled with high positional accuracy between the light-emitting part and the positioning hole, and can provide high quality performance.

DETAILED DESCRIPTION OF THE EMBODIMENTS

Figure 1:
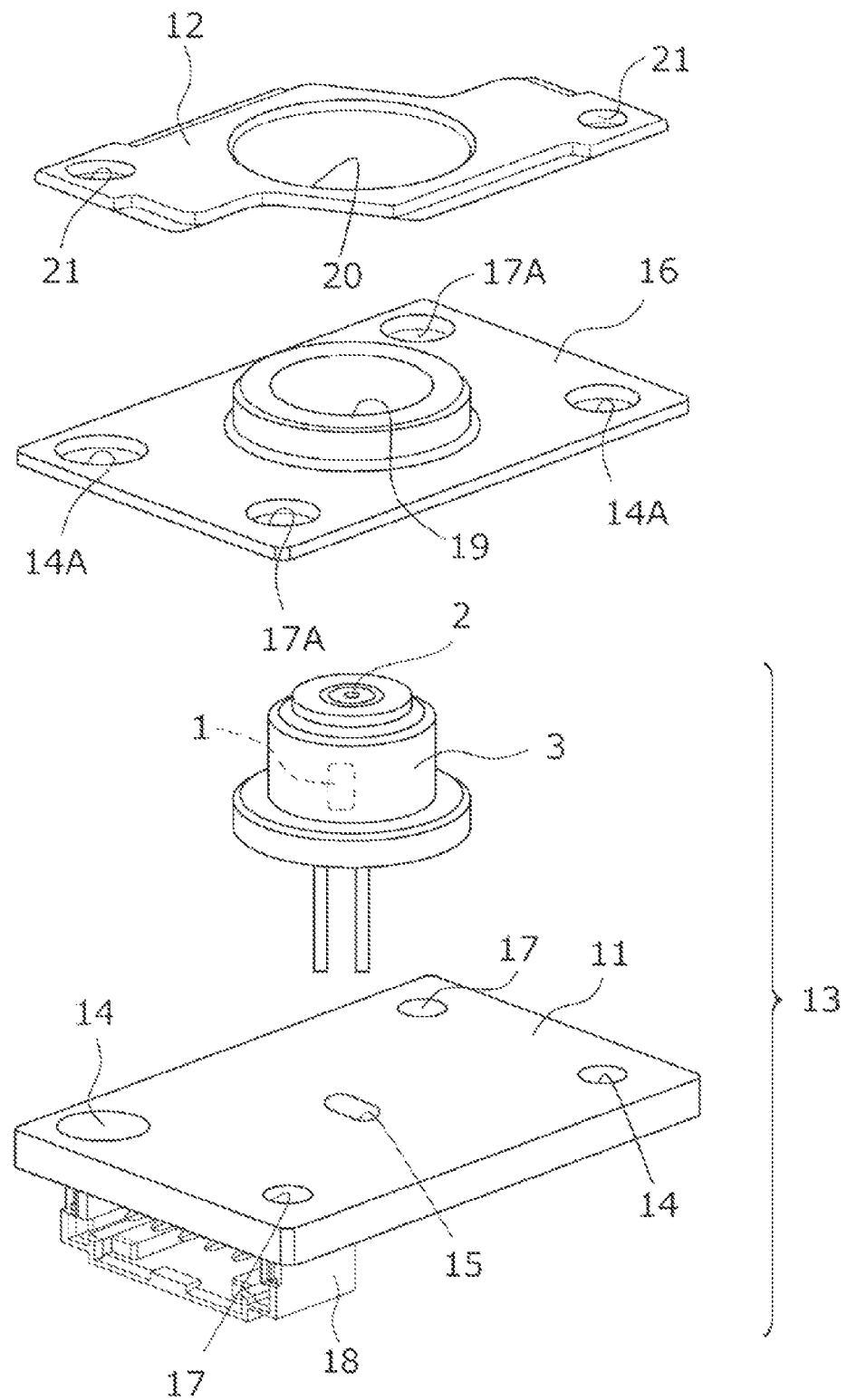
FIG. 1 is a schematic perspective view for illustrating a method of manufacturing a light-emitting device according to a first embodiment.

The embodiments shown below are intended as illustrative to give a concrete form to technical ideas of the present invention, and the scope of the invention is not limited to those described below. The sizes and the positional relationships of the members in each of the drawings are occasionally shown exaggerated for ease of explanation. Further, in the description below, the same designations or the same reference numerals denote the same or like members and duplicative descriptions will be appropriately omitted.

First Embodiment

A method of manufacturing a light-emitting device according to a first embodiment includes providing a light source having a first substrate and a light-emitting element disposed corresponding to the first substrate, and providing a second substrate defining one or more recesses or one or more through-holes which respectively later become a part of a positioning hole. Then, the second substrate is positioned above the first substrate to position the one or more positioning holes at positions spaced apart from a light-emitting part of the light source at a predetermined distance in a top plan view. This allows positioning of the one or more positioning holes corresponding to the position of the light-emitting part, after securing the position of light-emitting part of the light source. Thus, dimensional errors in the components and/or an error in assembling the light-emitting device affecting positioning of the positioning holes can be reduced. In the present specification, the recess(es) or through-hole(s) in a state after the second substrate is positioned above the first substrate is referred to as "positioning hole(s)". The recess(es) or through-hole(s) in a state before the second substrate is positioned above the first substrate is referred to as simply "recess(es) or through-hole (s)." Of the surfaces of the first substrate, a surface having the light-emitting element disposed thereon is referred to as the "upper surface" and the surface at opposite side of the upper surface is referred to as the "lower surface". The respective step and each constituent member will be described in detail below.

Providing Light Source 13 and Second Substrate 12

As shown in FIG. 1, a light source 13 and a second substrate 12 defining one or more recesses or one or more through-holes 21 which respectively later become a part of a positioning hole are provided. The light source 13 is a member including a first substrate 11 and a light-emitting element 1 disposed on the first substrate 11. In FIG. 1, the second substrate 12 is formed with through-holes 21 that later become positioning holes.

Light-Emitting Element 1

Figure 2A:
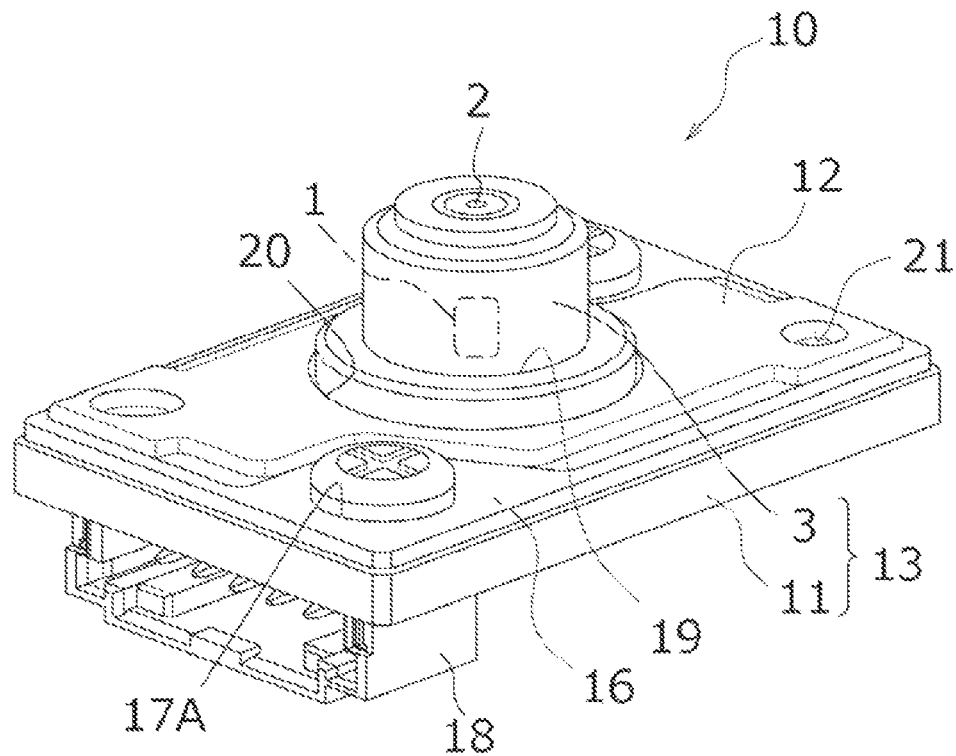
FIG. 2A is a schematic perspective view illustrating a light-emitting device according to the first embodiment.
Figure 2B:
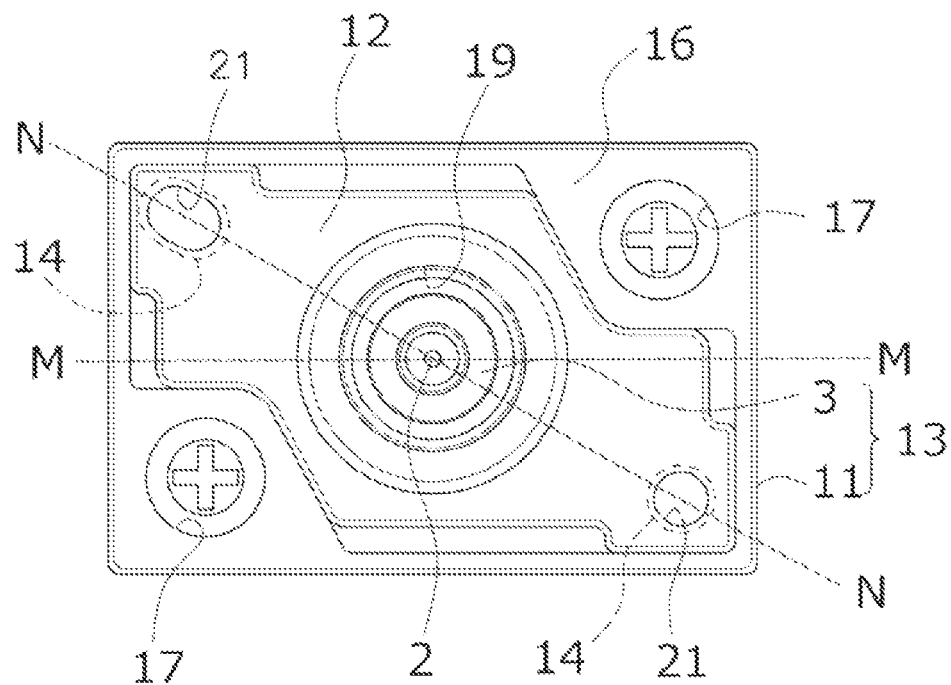
FIG. 2B is a schematic top view of the light-emitting device shown in FIG. 2A.
Figure 2C:
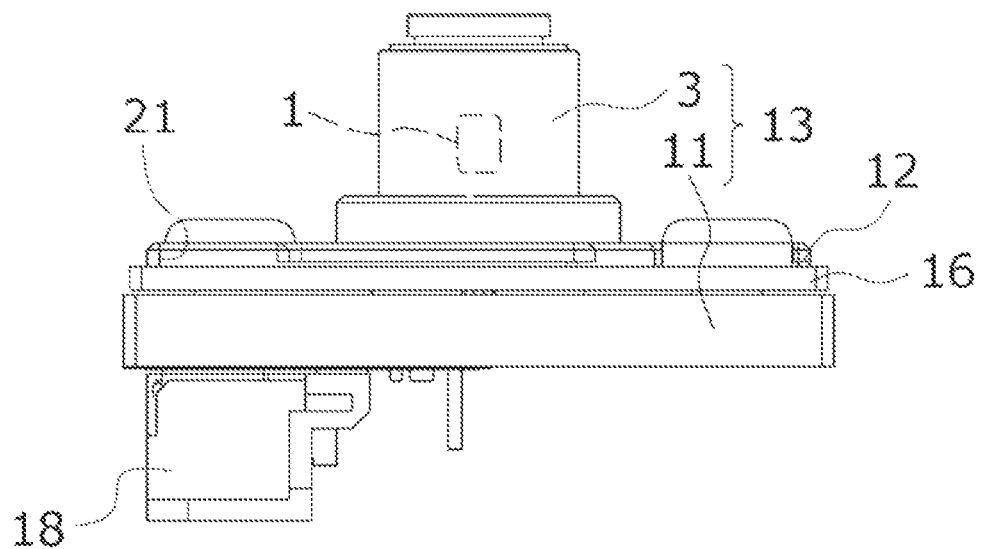
FIG. 2C is a schematic side view of the light-emitting device shown in FIG. 2A.
Figure 3:
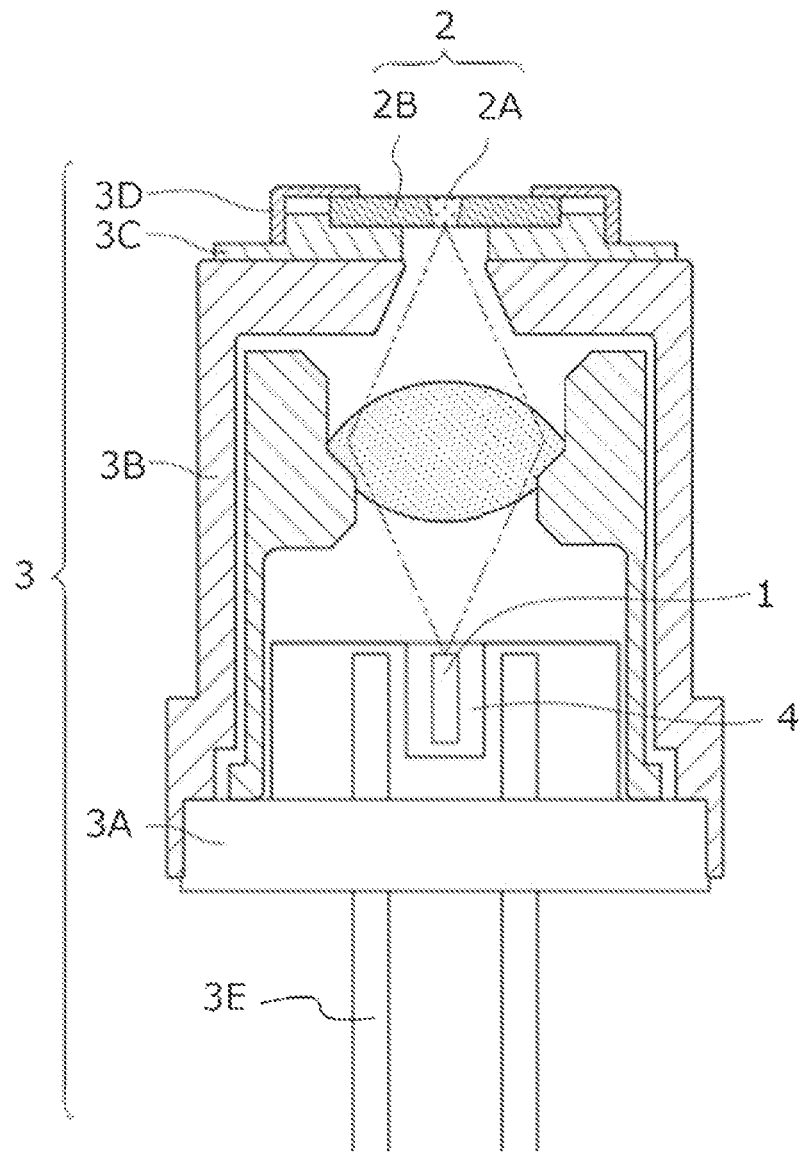
FIG. 3 is a schematic plan view showing a package and a wavelength converting member according to the first embodiment.

As shown in FIG. 1, FIG. 2A, and FIG. 2C, the light-emitting element 1 is disposed with respect to the first substrate 11. In the first embodiment, as shown in FIG. 1 and FIG. 3, the light-emitting element 1 is housed in the package 3 to be described later in the specification and the package 3 is disposed on the first substrate 11, such that the light-emitting element 1 is disposed with respect to the first substrate 11 via the package 3. For the light-emitting element 1, a light emitting diode element, a semiconductor laser element, or the like can be employed. Among those, a semiconductor laser element is preferable. Because laser light emitted from a semiconductor laser element spreads in a small region of space, positioning of a semiconductor laser element with high accuracy is particularly required. In the first embodiment, a GaN-based semiconductor laser element is used for the light-emitting element 1. The light-emitting element 1 is configured to emit light having a peak emission wavelength in a range of ultraviolet to infrared, for example, in a range of 300 to 600 nm. When the light-emitting element 1 is used in combination with a YAG fluorescent material, the light-emitting element 1 preferably has a peak emission wavelength in a range of 430 to 460 nm. The light-emitting element 1 can be configured to emit light having a far field pattern (FFP) in a circular shape or an elliptical shape with a major axis and a minor axis.

Package 3

As shown in FIG. 3, the light-emitting element 1 is preferably housed in the package 3. With the use of the package 3, the light-emitting elements 1 can be hermetically sealed. For example, as shown in FIG. 3, the package 3 can be assembled in a cylindrical shape, supporting a wavelength converting member 2. The package 3 can be structured with a single member or can be structured with two or more members. For example, the package 3 shown in FIG. 3 includes a base 3A, a cap 3B, a lower sleeve 3C, an upper sleeve 3D, and lead terminals 3E. The light-emitting element 1 can be secured on a sub-mount 4 through a die-bonding member such as an Au—Sn solder, an Ag paste, or an indium alloy. The base 3A of the package 3 includes a projected part and the sub-mount 4 is secured on the projected part. Thus, in the first embodiment, the light-emitting element 1 is disposed with respect to the first substrate 11 via the sub-mount 4 and the package 3. In the package 3, the cap 3B is welded to a lateral surface of the base 3A to enclose the light-emitting element 1. The cap 3B has an upper surface that defines a through-hole configured to extract laser light emitted from the light-emitting element 1. The lower sleeve 3C is disposed on the upper surface of the cap 3B. The lower sleeve 3C also defines a through-hole configured to extract laser light emitted from the light-emitting element 1, at a location corresponding to the through-hole of the cap 3B. The wavelength converting member 2 is disposed on the lower sleeve 3C to cover the through-hole of the lower sleeve 3C. The upper sleeve 3D holds a fluorescent material holder 2B of the wavelength converting member 2 to be described later in the specification from above and the upper sleeve 3D is welded to a lateral surface of the lower sleeve 3C.

The package 3 includes a plurality of lead terminals 3E each penetrate through an upper surface side and a lower surface the base 3A in an up-down direction. The plurality of lead terminals 3E are secured to the base 3A through an electrically insulating member. Each of the plurality of lead terminals 3E has an inner-lead part and an outer lead part. The inner-lead part is projected at the upper surface side of the base 3A and is electrically connected to the light-emitting element 1, and the outer lead part is projected at the lower surface side of the base 3A and is configured to be electrically connected to an external power source. In the package 3, the position of the wavelength converting member 2 is adjusted such that the center of the laser light from the light-emitting element 1 and the center of the wavelength converting member 2 are aligned when viewed from the light emitting surface side of the light-emitting element 1, that is in a top plan view, then, the wavelength converting member 2 is secured to the package 3. This arrangement allows for determining of the location of the positioning hole(s) after adjusting the positions of the light-emitting element 1 and the wavelength converting member 2, which allows highly accurate positioning of the positioning hole(s) with respect to the light emitting part of the light source.

For the material of the base 3A, for example, Cu can be used. For the material of the cap 3B, the lower sleeve 3C, and the upper sleeve 3D, for example, stainless steel can be used. Such a metal may be used as a base material and plating of Ni, Au, Ag, Al or the like may be applied on the entire surface or a portion of the surface of the structural component(s) of the base 3A.

As shown in FIG. 3, the wavelength converting member 2 includes, for example, the fluorescent material holder 2B and the fluorescent material part 2A disposed in the fluorescent material holder 2B. In the first embodiment, the fluorescent material holder 2B is a light-reflecting member. The wavelength converting member 2 is arranged above the light-emitting surface of the light-emitting element 1 to receive light from the light-emitting element 1, which is an excitation light for the wavelength converting member 2. For the material of the fluorescent material part 2A, any appropriate known fluorescent material can be used, according to the excitation wavelength emitted from the light-emitting element 1 to be used, color of light to be obtained, and so forth. Specific examples of the fluorescent material include a yttrium aluminum garnet (YAG)-based fluorescent material activated with cerium, a lutetium aluminum garnet (LAG)-based fluorescent material activated with cerium, a nitrogen-containing calcium aluminosilicate ($CaO$—$Al_2O_3$—$SiO_2$) activated with europium and/or chromium, a silicate (($Sr,Ba)_2SiO_4$) activated with europium, a β-sialon-based fluorescent material, and a KSF ($K_2SiF_6$:Mn)-system fluorescent material. Among those, a YAG-based fluorescent material that has good heat-resisting properties is preferably used. The fluorescent material part 2A can be formed with a glass material such as quartz glass containing a fluorescent material or ceramics material such as aluminum oxide containing a fluorescent material, which may further contain a light scattering material as needed. For the fluorescent material holder 2B, for example, ceramics such as aluminum oxide can be used. As shown in FIG. 2A and FIG. 2B, in the first embodiment, the light-emitting part is a region of the light source 13 from where wavelength-converted light by the wavelength converting member 2 is emitted to the outside. When the light-emitting device does not include a wavelength converting member, a region emitting light in a top plan view is the light-emitting part.

A light source employing a light-reflecting type wavelength converting member can also be used as the light source. In the present specification, the term "light-reflecting type wavelength converting member" refers to a wavelength converting member having a surface where light from the light-emitting element enters and a surface from where light is emitted are on a single surface.

As shown in FIG. 2A, the package 3 is disposed and secured with respect to the first substrate 11. Accordingly, the center of the laser light from the light-emitting element 1 is secured with respect to the first substrate 11. The package 3 can be secured with respect to the first substrate 11 by for example, welding. For example, the plurality of lead terminals 3E are respectively inserted in the through-hole 15 defined in the first substrate 11. With this arrangement, the package 3 is disposed with respect to the first substrate 11 such that the lead terminals 3E of the package 3 protrude from the lower surface-side of the first substrate 11, while the light-emitting surface is located at the upper surface-side of the first substrate 11. The through-hole 15 is formed with a relatively small opening such that a larger amount of heat from the light-emitting element 1 can be dispersed in the first substrate 11.

First Substrate 11

The first substrate 11 is configured to dispose the light-emitting element 1 thereon. One or two or more light-emitting elements 1 can be disposed on the first substrate 11. Further, the first substrate 11 preferably defines one or two or more through-holes 15 through which corresponding pairs of the lead terminals 3E are respectively inserted. The first substrate 11 preferably has a shape in a top plan view, a quadrangular shape or a shape similar to a quadrangular shape, of which a rectangular shape is more preferable. Such a shape allows for more efficient use of the first substrate 11. The first substrate 11 preferably has a flat region in its upper surface. This can facilitate disposing of a holding member 16 to be described later in the specification, the second substrate 12, or the like above the first substrate 11. In the first embodiment, as shown in FIG. 2A, the holding member 16 is disposed with respect to the upper surface of the first substrate 11, and the second substrate 12 is disposed on the upper surface of the holding member 16. Accordingly, the second substrate 12 is disposed above the first substrate 11 via the holding member 16. The presence of a flat region on the upper surface of the first substrate 11 can facilitate firmer securing of the second substrate 12, the holding member 16, and the like with respect to the first substrate 11 by welding or the like. The flat region is preferably provided on the first substrate 11 not only at a portion to be in contact with the second substrate 12 and the like but also at portions surrounding it. With this arrangement, the second substrate 12 and the like can be more tightly secured to the first substrate 11, by way of welding or the like. The term "flat region" refers to a region on the upper surface of the first substrate 11 that is substantially in parallel to the lower surface of the first substrate 11. Further, of the first substrate 11, the region in contact with the second substrate 12 and the like is preferably an uppermost surface of the first substrate 11. This allows for tightly securing the second substrate 12 and the like, to the first substrate 11.

The first substrate 11 can be formed with, for example, a metal (such as aluminum, an aluminum alloy, copper, a copper alloy, or the like) or ceramics (such as aluminum nitride, silicon carbide, or the like). When a wiring is formed on (and/or inside) the first substrate 11, the first substrate 11 may be formed with a resin material (such as a polyimide resin, an epoxy resin, or a liquid crystal polymer), or a metal may be used for a portion of the first substrate 11 and a resin material may be used for other portion of the first substrate 11. A portion or the entire of the first substrate 11 is preferably formed with a material with good thermal conductive properties such as a metal or ceramics. A portion or the entire of the first substrate 11 is more preferably formed with a metal. This allows for tightly securing the second substrate 12 and the like, to the first substrate 11 by way of welding.

As in the first embodiment, when the second substrate 12 defines one or more through-holes 21 and the second substrate 12 defining the one or more through-holes 21 is disposed directly above the first substrate 11, it is preferable that the first substrate 11 also defines one or more recesses or one or more through-holes 14 corresponding to the one or more through-holes of the second substrate 12. The one or more recesses or through-holes 14 of the first substrate 11 are configured such that, for example, when one or more positioning pins 34 of a light-emitting module 30, which are to be described later in the specification, are inserted in the one or more through-holes 21 of the second substrate 12, the one or more positioning pins 34 can also be inserted in the first substrate 11. With this arrangement, compared to a case in which the first substrate 11 is not formed with the one or more recess or through-holes 14, the one or more positioning pins 34 on the light-emitting module 30 can be made longer while allowing a reduction in the thickness of the second substrate 12. The one or more recesses or one or more through-holes 14 of the first substrate 11 are preferably formed before positioning the one or more positioning holes (i.e. prior to positioning the second substrate 12 above the first substrate 11). Accordingly, dust produced at the time of forming the one or more recesses or one or more through-holes 14 by using, for example, a drill or the like can be prevented from attaching to the components of the light-emitting device 10. Further, with positioning the first substrate 11 directly under the one or more through-holes 21 of the second substrate 12, the second substrate 12 with smaller sizes can be employed, which allows a reduction in the sizes of the light-emitting device 10, compared to a case in which the first substrate 11 is not positioned directly under the one or more through-holes 21. A single recess or through-hole 14 can be defined in the first substrate 11, but two or more recesses or two or more through-holes 14 are preferably defined in the first substrate 11. The light-emitting device 10 is positioned in the light-emitting module 30 by fitting the one or more positioning pins 34 of the light-emitting module 30 into the one or more recesses or one or more through-holes 14 of the first substrate 11 respectively. When two or more recesses or two or more through-holes 14 are defined in the first substrate 11, the recesses or through-holes 14 can be formed with the same sizes, or formed with different sizes. When the recesses or through-holes 14 are formed with different sizes, defining an opening of one of the recesses or through-holes 14 in an elliptic shape or an oblong shape allows finer adjustment such that when the distance(s) between the positioning pins 34 differs due to dimensional tolerance of the positioning pins 34, the positional pins 34 can be more reliably inserted in a respective one of the recesses or through-holes 14. The number of the one or more recesses or one or more through-holes 14 defined in the first substrate 11 is preferably the same as the number of the through-holes defined in the second substrate 12. Accordingly, the one or more recesses or one or more through-holes 14 of the first substrate 11 and the through-holes 21 of the second substrate 12 can be aligned with each other. When the first substrate 11 is formed with the one or more recesses or one or more through-holes 14, at the time of positioning the second substrate 12 above the first substrate 11, the one or more through-holes 21 of the second substrate 12 are positioned aligned with a respective one of the one or more recesses or one or more through-holes 14 of the first substrate 11 in a top plan view.

The recesses or through-holes 14 of the first substrate 11 are preferably formed at locations interposing the light-emitting element 1 disposed on or above the first substrate 11 in a top plan view. Also, the recesses or through-holes 14 of the first substrate 11 are more preferably formed at locations interposing the light-emitting element 1 and also the recesses or through-holes spaced apart from each other at a relatively large distance, for example, when the first substrate 11 has a rectangular shape in a top plan view, the recesses or the through-holes are formed on diagonal lines. With this arrangement, positioning holes positioned above a respective one of the recess or through-holes 14 of the first substrate 11 can be spaced apart from each other with a longer distance, which allows for positioning with high accuracy. The one or more recesses or one or more through-holes 14 of the first substrate 11 are preferably formed larger than the respective corresponding one or more through-holes 21 of the second substrate 12. With this arrangement, for example, when the positioning pins 34 are inserted in the one or more through-holes 21 of the second substrate 12, the positioning pins 34 are also inserted in the one or more recesses or through-holes 14 of the first substrate 11. The one or more recesses or one or more through-holes 14 are preferably defined with an opening of the maximum width or diameter in a range of 1 to 6 mm. With the maximum width or diameter of 1 mm or greater, the one or more positioning pins 34 of a larger diameter can be employed, which can improve mechanical strength of the positioning pins 34 inserted in the one or more recesses or one or more through-holes 14 can be improved. With the maximum width or diameter of 6 mm or smaller, a reduction in the size of the first substrate 11 can be obtained.

Further, when a holding member 16 is disposed between the first substrate 11 and the second substrate 12, one or more screw holes 17 may be defined in the first substrate 11 such that the holding member 16 and the first substrate 11 can be secured through one or more screws. The number and the size of the one or more screw holes 17 can be appropriately determined. One to four screw holes can be adapted. Two screw holes are preferable. This arrangement allows for a reduction in the sizes of the first substrate 11. Also as shown in FIG. 2A, a connector terminal 18 may be disposed on a surface of the first substrate 11 which is a surface different from the surface on which the light-emitting element 1 is disposed.

Second Substrate 12

The second substrate 12 is a substrate used to position the one or more positioning holes at respective predetermined distances apart from the light-emitting part of the light source 13. In a top plan view, the second substrate 12 has a shape smaller than a shape of the first substrate 1. This arrangement allows for a reduction in the sizes of the light-emitting device 10. The second substrate 12 preferably has a flat region in its lower surface that is configured to secure to the holding member 16 or the first substrate 11 or the like, later in the manufacturing. This allows for tightly securing the second substrate 12 to the holding member 16, the first substrate 11 or the like, through, for example, welding. As shown in FIG. 1, the second substrate 12 preferably has one or more parts on its outer periphery, having a thickness smaller than other parts of the second substrate 12. The second substrate 12 is preferably secured to the holding member 16, the first substrate 11 or the like through welding the parts having the smaller thickness to the first substrate 11 or the like. This arrangement can facilitate welding of the second substrate 12 to the holding member 16, the first substrate 11 or the like, compared to welding of the outer periphery of the second substrate 12 with a relatively large thickness. In the first embodiment, as shown in FIG. 2A and FIG. 2C, the second substrate 12 is welded to the holding member 16.

The second substrate 12 can be formed with, for example, a metal, ceramics, a resin material, a resin material containing an additive, as in the first substrate 11. Among those, a metal is preferable, because it facilitates securing of the second substrate 12 to the first substrate 11 or the like by way of welding. For the reasons described above, the first substrate 11, the second substrate 12, and the holding member 16 are preferably made of a metal.

The second substrate 12 defines one or more recesses or one or more through-holes 21. As shown in FIG. 1, when the first substrate 11 defines one or more recesses or one or more through-holes 14, the second substrate 12 defines one or more through-holes 21 so that the one or more recesses or one more through-holes 14 of the first substrate 11 and the one or more through-holes 21 of the second substrate respectively and continuously define one or more positioning holes. On the other hand, when the first substrate 11 does not include one or more recesses or one or more through-holes 14, the second substrate 12 may define one or more recesses that serve as the positioning holes, instead of the one or more through-holes 21. The one or more recesses or one or more through-holes 21 of the second substrate 12 are formed prior to positioning the one or more positioning hole (i.e. prior to positioning the second substrate 12 above the first substrate 11). Accordingly, dust produced at the time of forming the one or more recesses or one or more through-holes 21 by using, for example, a drill or the like can be prevented from attaching to the components of the light-emitting device 10. A single recess or through-hole 21 may be formed but two or more recesses or two or more through-holes 21 are preferably formed. Each of the one or more positioning pins 34 of the light-emitting module 30 are inserted in the respective one of the one or more recesses or one or more through-holes 21 of the second substrate 12. Thus, the light-emitting device 10 is positioned in the light-emitting module 30. Moreover, highly accurate positioning of the light-emitting device 10 in the light-emitting module 30 can be achieved. When the second substrate 12 defines one or more through-holes 21, the number of the through-holes 21 can be determined corresponding to the number of the recesses or through-holes 14 defined in the first substrate 11. For example, when the number of the through-holes 21 of the second substrate 12 is the same as the number of the recesses or through-holes 14 defined in the first substrate 11, a single through-hole 21 corresponding to a single recess or through-hole 14 may be formed, but two through-holes 21 corresponding to two recesses or two through-holes 14 are preferably formed as shown in FIG. 1. With this arrangement, the positioning pin(s) 34 can be inserted in the through-hole(s) 21 of the second substrate 12 and also in the recess(es) or through-hole(s) 14 of the first substrate 11, and thus can achieve the positioning. The one or more recesses or one or more through-holes 21 of the second substrate 12 serve as positioning hole(s) after the second substrate 12 is positioned above the first substrate 11. The one or more positioning pins 34 formed on the module member 31 of the light-emitting module 30 are fit in the corresponding one or more positioning holes. Thus, the light-emitting device 10 can be disposed at a predetermined location in the light-emitting module 30. In particular, forming of two or more recesses or two or more through-holes 21 allows for positioning with high accuracy and also strong securing after the positioning. That is, each of the two or more positioning pins 34 of the light-emitting module 30 can be inserted into a respective one of the two or more through-holes 21, which allows for precise placement of the light-emitting device 10 in the light-emitting module 30. The one or more recesses or one or more through-holes 21 of the second substrate 12 that serve as the positioning holes are preferably defined with an opening of the maximum width or diameter in a range of 0.5 to 5 mm. With the maximum width or diameter of 0.5 mm or greater, the positioning pins 34 of a larger diameter can be employed, which can improve mechanical strength of the positioning pins 34 inserted in the recesses or the through-holes 21 can be improved. With the maximum width or diameter of 5 mm or smaller, a reduction in the sizes of the second substrate 12 can be obtained.

In the first embodiment, as shown in FIG. 2B, when the second substrate 12 is positioned above the first substrate 11 later in manufacturing, the through-holes 21 of the second substrate 12 are aligned with the one or more recesses or one or more through-holes 14 of the first substrate 11 in a top plan view. The through-holes 21 of the second substrate 12 are smaller than the corresponding recesses or through-holes 14 of the first substrate 11. With this arrangement, for example, when the positioning pins 34 are inserted in the through-holes 21 of the second substrate 12, the positioning pins 34 can also be inserted in the recesses or through-holes 14 of the first substrate 11. The one or more recesses or one or more through-holes 21 defined in the second substrate 12 are preferably formed with an opening substantially the diameter of the corresponding one or more positioning pins 34 of the light-emitting module 30 in a top plan view, such that the respective positioning pins 34 can fit in the corresponding through-holes 21. Accordingly, highly accurate positioning of the light-emitting device 10 in the light-emitting module 30 can be achieved. The term "substantially the diameter" used above refers to a difference of the maximum width or the diameter between the one or more recesses or through-holes 21 and the corresponding one or more positioning pins 34 is within 0.05 mm. When the one or more through-holes 21 of the second substrate 12 are positioned above the one or more recesses or through-holes 14 of the first substrate 11, the maximum width or the diameter of each of the one or more recess or through-holes 14 in the first substrate 11 is preferably larger in a range of 0.5 to 1 mm than the maximum width or the diameter of a corresponding one of the one or more through-holes 21 in the second substrate 12. An increase of 0.5 mm or greater, a region on the first substrate 11 allowing positioning of the second substrate 12 above the first substrate 11 can be increased. An increase of less than 1 mm, a reduction in the sizes of the first substrate 11 can be realized. The recesses or through-holes 21 of the second substrate 12 are preferably formed at locations interposing the light-emitting element 1 in a top plan view. Also, in a top plan view, the recesses or through-holes 21 of the second substrate 12 are more preferably formed at locations interposing the light-emitting element 1 and also are spaced apart from each other at a relatively large distance, for example, when the first substrate 11 has a rectangular shape in a top plan view, the through-holes 21 of the second substrate 12 are formed above diagonal lines of the rectangular first substrate 11.

In the first embodiment, the second substrate 12 defines a through-hole 20 configured to allow extraction of light from the light-emitting element 1 disposed with respect to the first substrate 11. The package 3 is exposed from the through-hole 20. The size of the through-hole 20 can be determined according to the shape and size of the light-emitting element 1 or the package 3 configured to house the light-emitting element 1. The through-hole 20 is preferably defined with the maximum width or diameter of the opening that is larger than that of the through-hole 19 defined in the holding member 16 to be described later in the specification. With this arrangement, when the light-emitting part is located below the second substrate 12, a possibility of light from the light-emitting part hitting the second substrate 12 can be reduced. As shown in FIG. 2A, the diameter of the through-hole 20 of the second substrate 12 is larger than the diameter of the through-hole 19 of the holding member 16. When screw holes 17 are formed in the first substrate 11 to secure the first substrate 11 and the holding member 16, the second substrate 12 can be formed in a shape that does not cover regions formed with the screw holes 17. Alternatively, the second substrate may be formed with through-holes in conformity to the screw holes 17. In the first embodiment, the second substrate 12 is a single substrate having a plate-like shape. This can facilitate positioning of the second substrate 12 above the first substrate 11. In the first embodiment, the holding member 16 and the first substrate 11 are screw-fastened beforehand, such that the second substrate 12 is preferably positioned above the first substrate 11 so as not to be in contact with the screws. Thus, the second substrate 12 can be disposed on an upper surface of the holding member 16.

Holding Member 16

The holding member 16 is configured to hold the package 3 positioned on the first substrate 11 from above. As shown in FIG. 1, the holding member 16 holds the cap 3B of the package 3 from above to tightly secure the package 3 to the first substrate 11 such that separation of the package 3 from the first substrate 11 can be prevented. Accordingly, for example, when the package 3 is subjected to an external impact, a possibility of the package 3 separating from the first substrate 11 can be reduced. Further, the second substrate 12 is not used to hold the package 3 from above, but the holding member 16 that is a different member than the second substrate 12 is used to hold the package 3 from above, which allows positioning of the second substrate 12 above the first substrate 11 with a relatively high precision. That is, when the second substrate 12 is used to hold the package 3 from above, the second substrate 12 being in contact with the package 3 may reduce the positioning precision of the second substrate 12, but the use of the holding member 16 that is a separate member can prevent such a reduction in precision. As shown in FIG. 1 and FIG. 3, the holding member 16 includes a protruding part protruded upward configured to hold a part of a cap 3B of the package 3 and defining a through-hole 19 at its center, one or more through-holes 17A configured to receive corresponding screws such that the holding member 16 is screw-fastened to the first substrate 11, and one or more through-holes 14A provided to secure passages of the positioning holes. The holding member 16 is screw-fastened to the first substrate 11 using the screw through-holes 17A, prior to positioning the positioning holes. Accordingly, the second substrate 12 can be disposed above the holding member 16. For the material of the holding member 16, the materials similar to those for the first substrate 11, stainless steel, iron, or the like can be used. Among those, a metal is preferably used. With this, the holding member 16 and the second substrate 12 can be welded to each other. Further, the strength of the holding member 16 can be increased. It is more preferable that the first substrate 11 and the second substrate 12 are respectively made of a metal material facilitating welding. Accordingly, welding strength between the holding member 16 and the first substrate 11 and between the holding member 16 and the second substrate 12 can be improved. Further, corrosion of the holding member 16 and the first substrate 11 and the second substrate 12 can be reduced.

Positioning of Positioning Hole(s)

As shown in FIG. 2A and FIG. 2B, the second substrate 12 is positioned above the first substrate 11 to position the positioning holes. With positioning the second substrate 12 above the first substrate 11, the recesses or through-holes 14 of the first substrate 11 and the recesses or through-holes 21 of the second substrate 12 are aligned with each other, thus forming the positioning holes. When the first substrate 11 is not formed with a recess or through-hole 14, the second substrate 12 is positioned above the first substrate 11 such that only the recesses or through-hole 21 of the second substrate 12 serve as the positioning holes. In the first embodiment, securing can be performed by using a technique common in the art, such as through an adhesive, by way of thermal fusion bonding, welding, screw fastening, or the like. Among those, welding is preferably used. This allows tighter securing compared to the use of an adhesive or the like. In the first embodiment, by way of welding, a flat region of the holding member 16 and a flat region of the second substrate 12 are secured to each other. Then, the second substrate 12 is positioned above the first substrate 11 such that each of the positioning holes is spaced apart from a light-emitting part of the light source 13 a predetermined distance in a top plan view. That is, after the light-emitting part of the light source 13 is secured to a certain position, the positioning holes can be positioned corresponding to the position of the light-emitting part, such that dimensional errors in the components and/or an error in assembling the light-emitting device 10 affecting positioning of the positioning holes can be reduced.

It is preferable that the positioning holes are positioned as described below. As shown in FIG. 2B, when the positioning holes (that is, the overlapped portions of the through-hole 14 and the through-hole 21, and when the holding member 16 is employed, the overlapped portions of the through-hole 14, the through-hole 14A of the holding member 16, and the through-hole 21) are positioned to be interposing the light-emitting element 1 in a top plan view, among two or more positioning holes, a first positioning hole and a second positioning hole, and a first straight line (N-N line in FIG. 2B) passing through the first positioning hole and the second positioning hole are assumed. The first straight line and a second straight line and a third straight line that to be described later in the specification are imaginary lines. The locations of the positioning holes can be determined on the first straight line (N-N line) passing through the light-emitting part (preferably the center of the light-emitting part). Compared to the locations determined using the first straight line that does not pass the light-emitting part, the locations determined as described above can improve positioning precision of the positioning holes. Further, when the first straight line (N-N line) passes through the center of the light-emitting part, the positioning precision of the positioning holes can be further improved. Another example of when the positioning holes are positioned interposing the light-emitting element 1 in a top plan view, among two or more positioning holes, a first positioning hole and a second positioning hole, and a first straight line (N-N line in FIG. 2B) passing through the first positioning hole and the second positioning hole are assumed, and also, a second straight line (M-M line in FIG. 2B) extending parallel to a major axis of the light emitting part is assumed. The positioning holes can be positioned at locations on the first straight line (N-N line), such that the first straight line (N-N line) passes through the light-emitting part (preferably the center of the light-emitting part) and the first straight line (N-N line) is configured at a predetermined angle (for example in a range of 20° to 40°) to the second straight line (M-M line). With this arrangement, good positioning precision with the positioned positioning holes can be achieved, compared to the case in which the locations of the positioning holes are determined using the first straight line that does not pass the light-emitting part. When the first straight line (N-N line) passes through the center of the light-emitting part, positioning precision with the positioned positioning holes can be further improved. Instead of the second straight line (M-M line) extending parallel to the major axis of the light emitting part in the example shown in FIG. 2B, a line extending parallel to a minor axis of the light emitting part may be assumed as the second straight line.

When the positioning holes are not formed at locations interposing the light-emitting element 1, a first straight line connecting a first positioning hole and a second positioning hole among two or more positioning holes is assumed and a second straight line extending parallel to the major axis of the light emitting part is assumed. The recesses or the through-holes that serve as the positioning holes can be formed at the locations where a third straight line connecting the middle point of the first straight line and the light-emitting part (preferably the center of the light-emitting part) has a predetermined length (for example, a length in a range of ½ to ⅒, preferably ⅓ to ⅙ of the length of the first straight line) and the angle between the first straight line and the third straight line and the angle between the second straight line and the third straight line are in a predetermined range (for example 20° to 40°). Instead of the second straight line extending parallel to the major axis of the light emitting part, a line extending parallel to a minor axis of the light emitting part may be assumed as the second straight line.

Light-Emitting Device

As shown in FIG. 2A, the light-emitting device 10 according to a first embodiment includes a light source 13 having a first substrate 11 and a light-emitting element 1 disposed corresponding to the first substrate 11, and a second substrate 12 disposed on or above the first substrate 11. The first substrate 11 defines one or more recesses or one or more through-holes 14 respectively configured to be a part of one or more positioning holes. The second substrate 12 defines one or more through-holes 21 respectively configured to be a part of one or more positioning holes that are respectively located above the recesses or through-holes 14 of the first substrate 11, and are formed smaller than the corresponding recesses or through-holes 14 of the first substrate 11 in a top plan view. That is, the one or more recesses or one or more through-holes 14 of the first substrate 11 and the one or more through-holes 21 for the one or more positioning holes of the second substrate 12 are aligned with each other, partially or entirely overlapped with each other, to form the positioning holes. In the first embodiment, the positioning holes of the second substrate 12 are through-holes. With the arrangement as described above, the distances between the light-emitting part pf the light source 13 and the positioning holes can be determined by the relatively small through-holes 21 of the second substrate 12, which allows for highly precise positioning of the light-emitting device 10 in the light-emitting module 30. Accordingly, it becomes possible to provide the high-quality light-emitting device 10 and further, the high-quality light-emitting module 30.

Method of Manufacturing a Light-Emitting Module

Figure 4:
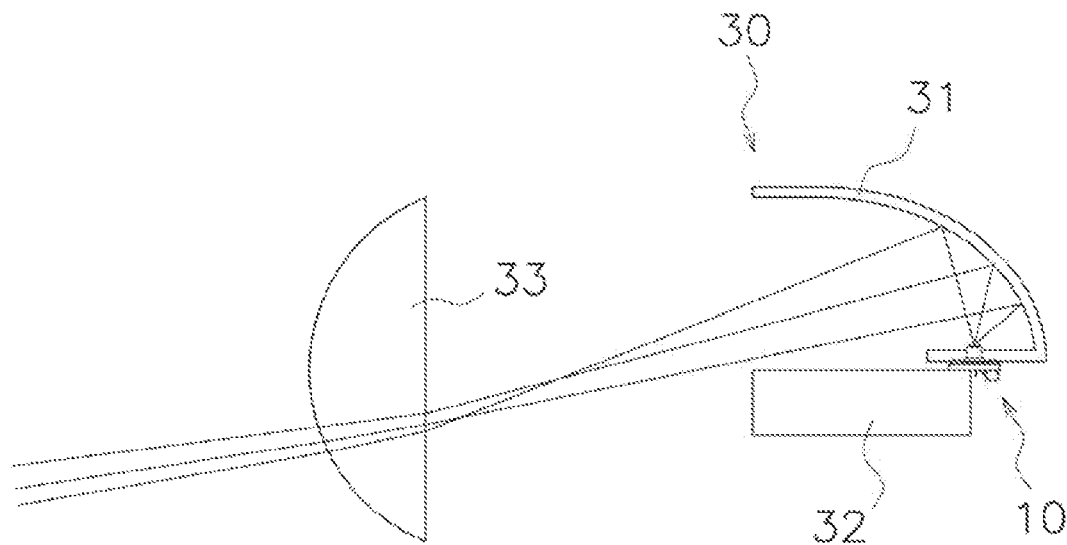
FIG. 4 is a schematic cross-sectional view of a light-emitting module having a light-emitting device according to the first embodiment.
Figure 5:
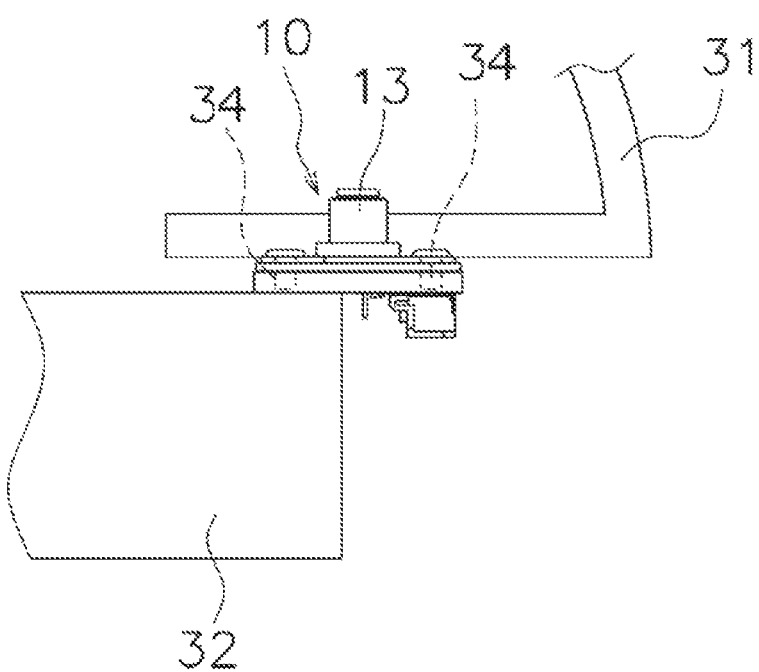
FIG. 5 shows a partially enlarged view of the light-emitting module shown in FIG. 4.

In a method of manufacturing a light-emitting module includes, as shown in FIG. 4 and FIG. 5, providing a module member 31 having one or more positioning pins 34, in addition to the method of manufacturing the light-emitting device 10 according to the first embodiment. The one or more positioning pins 34 of the module member 31 are respectively fit in the one or more positioning holes of the light-emitting device 10. In the light-emitting module 30 manufactured through such a series of processes, the light-emitting part of the light-emitting device 10 can be disposed with high precision to the one or more positioning pins 34, which facilitate manufacturing of the light-emitting module 30 with the light-emitting device 10 disposed with high precision.

For the third substrate 31 (e.g., module member 31) of the light-emitting module 30, a known substrate in the art can be used. As shown in FIG. 4 and FIG. 5, the light-emitting device 10 is disposed on a heat sink 32, and the third substrate 31 is placed on the second substrate 12 of the light-emitting device 10. As shown in FIG. 5, the third substrate 31 has two positioning pins 34 on its lower surface. Each of the positioning pins 34 is fit into corresponding one of the positioning holes of the light-emitting device 10 from above. Accordingly, highly accurate positioning of the light-emitting part of the light-emitting device 10 in the light-emitting module 30 can be achieved. In the light-emitting module 30, the third substrate 31 also serves as a reflector to reflect light emitted from the light-emitting device 10, and an optical member 33 to condense the reflected light is further provided. For the optical member 33, a lens or the like can be used. The third substrate may also be configured to serve as a heat sink. The positioning pins 34 of the light-emitting module 30 preferably have a circular shape in a top plan view, when the recesses or through-holes are formed with circular openings. When the positioning pins 34 have a circular shape in top view, an edge of each of the positioning holes that is in contact with a corresponding edge of a respective one of the positioning pins 24 and the center of respective positioning pins 34 can be at a uniform distance, such that the light-emitting part of the light-emitting device 10 can be disposed with high precision with respect to the positioning pins 34. The positioning pins 34 preferably have a length in a range of 1 to 10 mm. With the length of 1 mm or greater, lateral surfaces of the positioning pins 34 can be secured perpendicular to the upper surface of the light-emitting device 10. With the length of 10 mm or less, a reduction in the sizes of the light-emitting module 30 can be realized. Each of the positioning pins 34 preferably has the maximum width or diameter in a range of 0.5 to 3 mm in a top plan view. With the maximum width or diameter of 0.5 mm or greater, mechanical strength can be improved. With the maximum width or diameter of 3 mm or less, the positioning holes can be formed with a smaller widths or diameters, which allows for a reduction in the sizes of the light-emitting device 10. The positioning pins 34 can be formed with, for example, a metal (such as aluminum, an aluminum alloy, copper, a copper alloy, or the like) or resin (such as polyimide resin, epoxy resin, liquid crystal polymer, or the like).

Second Embodiment

Figure 6:
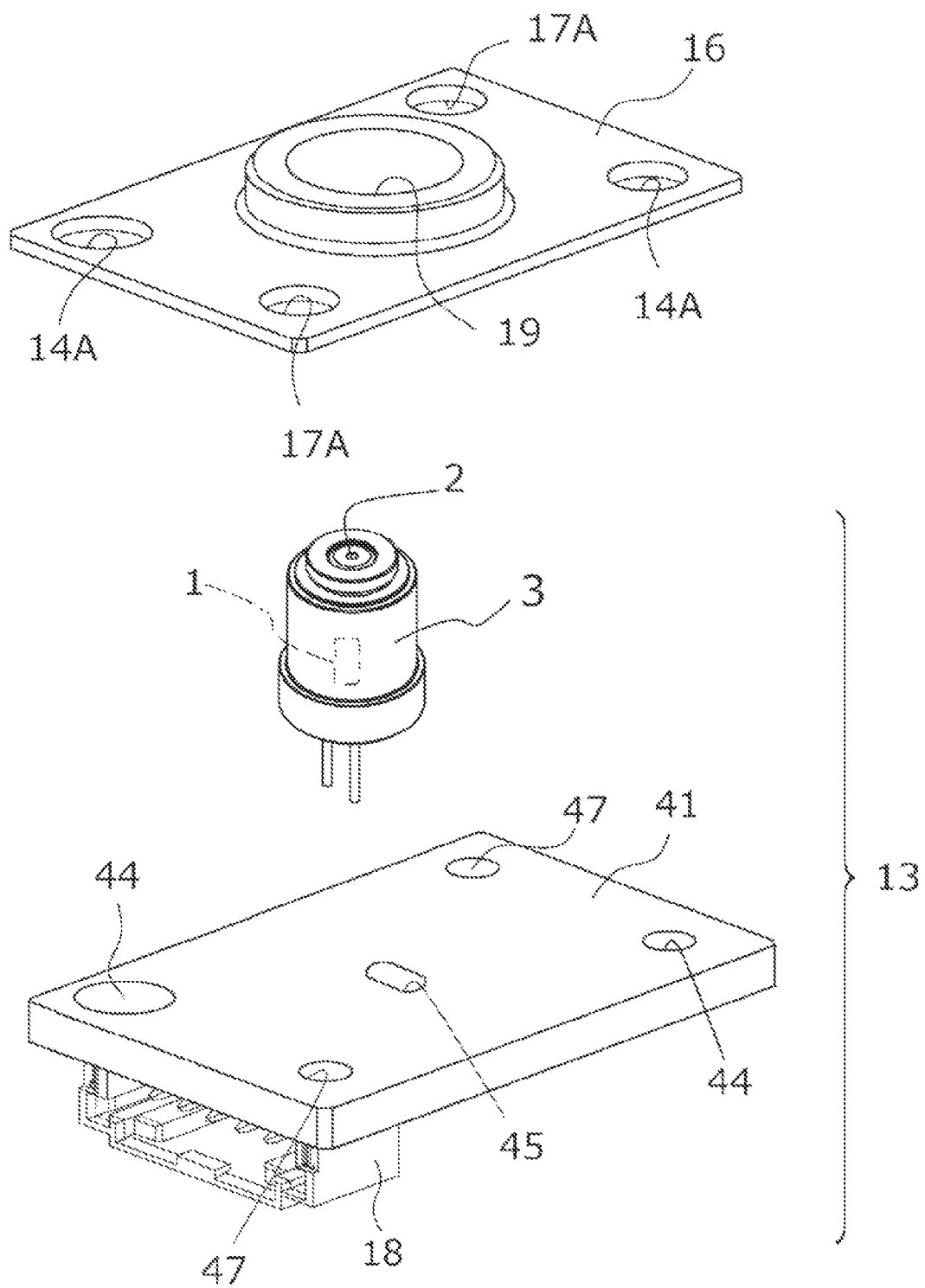
FIG. 6 is a schematic perspective view for illustrating a method of manufacturing a light-emitting device according to a second embodiment.

A method of manufacturing a light-emitting device according to a second embodiment will be illustrated below with reference to FIG. 6. In a method of manufacturing a light-emitting device according to the second embodiment, a light source 13 having a first substrate 41 and a light-emitting element 1 disposed corresponding to the first substrate 41, is provided. Then, one or more through-holes 44 respectively configured to be a part of positioning holes are formed in the first substrate 11 at locations spaced apart from a light-emitting part of the light source 13 at a predetermined distance in a top plan view. In the method of manufacturing a light-emitting device according to the second embodiment, the one or more through-holes 44 for positioning holes are formed only in the first substrate 41 and the second substrate 12 is not provided, which are different from the method of manufacturing a light-emitting device according to the first embodiment. Other than the above, the method of manufacturing a light-emitting device according to the second embodiment is similar to that according to the first embodiment. Further, as in the first embodiment, the first substrate 41 defines one or more screw holes 47 and a through-hole 45 which is configured to receive the lead terminals 3E of the package 3. The one or more through-holes 44 are formed after the relative positional relationship between the first substrate 41 and the light-emitting element 1 is determined, that is, after the package 3 is secured to the first substrate 41. The one or more through-holes 14A of the holding part 16 are formed larger than the one or more through-holes 44 of the first substrate 41 such that the through-holes 44 can be easily formed. The through-holes (through-hole 45, screw holes 47, or the like) other than the one or more through-holes 44 may be formed before the relative positional relationship between the first substrate 41 and the light-emitting element 1 is determined. Also with a method of manufacturing according to the second embodiment, the one or more positioning holes can be formed corresponding to the position of the light-emitting part after determining the location of the light-emitting part of the light source 13, such that dimensional errors in the components and/or an error in assembling the light-emitting device 10 that affect positioning of the one or more positioning holes can be reduced. Further, the second substrate 12 is not needed to provide, which can reduce the manufacturing cost of the light-emitting device 10. As in the first embodiment, in the second embodiment, the package 3 disposed with respect to the first substrate 11 is held from above by the holding member 16, by fitting the one or more screws through the corresponding one or more through-holes 17A for the screws into the screw holes 47 and secured.

In the method according to the second embodiment, providing the light source 13 can be performed similar to that in the first embodiment. The one or more through-holes 44 for positioning holes can be formed in the first substrate 41 by using a drill or the like. The locations and sizes of the one or more through-holes 44 for the positioning holes can be determined similar to the locations and sizes of the corresponding one or more through-holes 21 for positioning holes described above. The light source 13 can be formed with a material similar to those described above. Further, instead of the one or more through-holes 44, one or more recesses may be formed.

The light-emitting device according to the present disclosure can be suitably used for various display devices, luminaires, image reading apparatus, projectors, endoscopes, vehicular headlights, or the like.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A method of manufacturing a light-emitting device, comprising:
   providing a light source including a first substrate and a light-emitting element coupled to the first substrate, the first substrate defining a through-hole arranged below the light-emitting element; and
   after the providing of the light source, forming one or more positioning holes in the first substrate at locations spaced apart from a light-emitting part of the light source by predetermined distances in a top plan view, wherein
   the through-hole is smaller than the one or more positioning holes in the top plan view.

2. The method of manufacturing a light-emitting device according to claim 1, wherein
   the one or more positioning holes includes at least a first positioning hole and a second positioning hole.

3. The method of manufacturing a light-emitting device according to claim 2, wherein
   the one or more positioning holes are formed so that a first imaginary straight line connecting the first positioning hole and the second positioning hole passes through the light-emitting part in the top plan view.

4. The method of manufacturing a light-emitting device according to claim 3, wherein
   the one or more positioning holes are formed so that the first imaginary straight line passes through a center of the light-emitting part in the top plan view.

5. The method of manufacturing a light-emitting device according to claim 1, wherein
   the forming of the one or more positioning holes in the first substrate further includes arranging a holding member above an upper surface of the first substrate.

6. The method of manufacturing a light-emitting device according to claim 1, wherein
   the light-emitting element is a semiconductor laser element, and
   the light source further includes a wavelength converting member to be irradiated with a laser light from the semiconductor laser element, and the wavelength converting member serves as the light-emitting part of the light source.

7. The method of manufacturing a light-emitting device according to claim 6, wherein
   the light-emitting element is a GaN-based semiconductor laser element.

8. The method of manufacturing a light-emitting device according to claim 6, wherein
   the light-emitting element is configured to emit light having a peak emission wavelength in a range of 430 to 460 nm.

9. The method of manufacturing a light-emitting device according to claim 6, wherein
   the wavelength converting member includes a fluorescent material part.

10. The method of manufacturing a light-emitting device according to claim 6, wherein
    the wavelength converting member includes an yttrium aluminum garnet (YAG)-based fluorescent material activated with cerium.

11. The method of manufacturing a light-emitting device according to claim 1, wherein
    the first substrate is formed with a metal or ceramics.

12. The method of manufacturing a light-emitting device according to claim 1, wherein
    the first substrate is formed with a metal and a resin material.

13. The method of manufacturing a light-emitting device according to claim 1, wherein
    the one or more positioning pins are formed with a metal.

14. The method of manufacturing a light-emitting device according to claim 1, wherein
    the one or more positioning pins are formed with a resin.

15. The method of manufacturing a light-emitting device according to claim 1, further comprising
    inserting one or more screws respectively into one or more screw holes formed in the first substrate from the same side on which the one or more positioning pins of the module member are inserted into the one or more positioning holes of the first substrate.

16. The method of manufacturing a light-emitting device according to claim 5, further comprising
    inserting one or more screws respectively into one or more screw holes formed in the first substrate and one or more screw holes formed in the holding member from the same side on which the one or more positioning pins of the module member are inserted into the one or more positioning holes.

17. The method of manufacturing a light-emitting device according to claim 5, wherein
- the providing of the light source includes providing the first substrate defining one or more screw holes into which one or more screws are inserted, and
- the arranging of the holding member includes providing the holding member defining one or more first through-holes into which the one or more positioning pins are inserted and one or more second through-holes into which the one or more screws are inserted.

18. The method of manufacturing a light-emitting device according to claim 1, wherein
- providing a module member having one or more positioning pins; and
- inserting the one or more positioning pins of the module member respectively into the one or more positioning holes of the first substrate from a side on which the light-emitting element is provided.

19. The method of manufacturing a light-emitting device according to claim 15, wherein
- the first substrate has a quadrangular shape in the top plan view.

20. The method of manufacturing a light-emitting device according to claim 19, wherein
- the forming of the one or more positioning holes includes forming two positioning holes respectively in the vicinity of two corners diagonally opposing each other.

21. The method of manufacturing a light-emitting device according to claim 20, wherein
- the first substrate defines two screw holes constituting the one or more screw holes, and
- the two screw holes are arranged respectively in the vicinity of two corners diagonally opposing each other in which the positioning holes are not arranged.

* * * * *